US011299820B2

(12) United States Patent
Choi et al.

(10) Patent No.: US 11,299,820 B2
(45) Date of Patent: Apr. 12, 2022

(54) ELECTRON BEAM HEATING AND ATOMIC SURFACE RESTRUCTURING OF SAPPHIRE SURFACE

(71) Applicant: United States of America as represented by the Administrator of NASA, Washington, DC (US)

(72) Inventors: Sang H. Choi, Poquoson, VA (US); Adam J. Duzik, Yorktown, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 0 days.

(21) Appl. No.: 15/661,903

(22) Filed: Jul. 27, 2017

(65) Prior Publication Data

US 2018/0030616 A1 Feb. 1, 2018

Related U.S. Application Data

(60) Provisional application No. 62/367,971, filed on Jul. 28, 2016.

(51) Int. Cl.
*C30B 23/06* (2006.01)
*H01L 21/02* (2006.01)
(Continued)

(52) U.S. Cl.
CPC .......... *C30B 23/063* (2013.01); *C30B 23/025* (2013.01); *C30B 25/06* (2013.01);
(Continued)

(58) Field of Classification Search
CPC .. C30B 1/00; C30B 1/02; C30B 23/00; C30B 23/02; C30B 23/025; C30B 23/06;
(Continued)

(56) References Cited

U.S. PATENT DOCUMENTS 4,605,469 A * 8/1986 Shih ........................ C30B 23/02
117/108
5,556,472 A * 9/1996 Nakamura ............... C23C 14/24
118/719
(Continued)

OTHER PUBLICATIONS

Yeonjoon Park, Glen C. King, Sang H. Choi, "Rhombohedral epitaxy of cubic SiGe on trigonal c-plane sapphire", Journal of Crystal Growth, vol. 310, Issue 11, pp. 2724-2731 (May 15, 2008).
(Continued)

*Primary Examiner* — Kenneth A Bratland, Jr.
(74) *Attorney, Agent, or Firm* — Jennifer L. Riley; Robin W. Edwards; Helen M. Galus

(57) ABSTRACT

Systems, methods, and devices of the various embodiments may provide a mechanism to enable the growth of a rhombohedral epitaxy at a lower substrate temperature by energizing the atoms in flux, thereby reducing the substrate temperature to a moderate level. In various embodiments, sufficiently energized atoms provide the essential energy needed for the rhombohedral epitaxy process which deforms the original cubic crystalline structure approximately into a rhombohedron by physically aligning the crystal structure of both materials at a lower substrate temperature.

17 Claims, 4 Drawing Sheets

(51) Int. Cl.
  *C30B 29/52* (2006.01)
  *C30B 29/20* (2006.01)
  *C30B 23/02* (2006.01)
  *C30B 25/06* (2006.01)
  *C30B 25/18* (2006.01)
  *C30B 29/40* (2006.01)
  *C30B 29/48* (2006.01)

(52) U.S. Cl.
  CPC ............ *C30B 25/186* (2013.01); *C30B 29/20* (2013.01); *C30B 29/52* (2013.01); *H01L 21/0242* (2013.01); *H01L 21/0254* (2013.01); *H01L 21/02381* (2013.01); *H01L 21/02433* (2013.01); *H01L 21/02532* (2013.01); *H01L 21/02546* (2013.01); *H01L 21/02562* (2013.01); *H01L 21/02609* (2013.01); *C30B 29/406* (2013.01); *C30B 29/48* (2013.01)

(58) Field of Classification Search
  CPC ....... C30B 23/063; C30B 25/00; C30B 25/02; C30B 25/10; C30B 25/105; C30B 25/18; C30B 25/186; C30B 29/00; C30B 29/10; C30B 29/16; C30B 29/20; C30B 29/406; C30B 29/48; C30B 29/52; C30B 33/00; C30B 33/02; H01L 21/0242; H01L 21/02433; H01L 21/02609; H01L 21/02532; H01L 21/0254; H01L 21/02562; H01L 21/02658
  USPC ....... 117/3, 84, 88–90, 92, 94, 98, 101, 103, 117/106, 200–204, 902, 905, 937, 950
  See application file for complete search history.

(56) References Cited

U.S. PATENT DOCUMENTS

| | | | |
|---|---|---|---|
| 6,544,867 B1 * | 4/2003 | Webb | C30B 23/02 257/E21.1 |
| 6,673,149 B1 * | 1/2004 | Solomon | C30B 23/02 117/101 |
| 7,341,883 B2 | 3/2008 | Park et al. | |
| 8,226,767 B2 | 7/2012 | Park et al. | |
| 2005/0284360 A1 * | 12/2005 | Rueger | C23C 16/45529 117/84 |

OTHER PUBLICATIONS

Yeonjoon Park, Sang H. Choi, "SiGe finds a fantastic home on sapphire", Compound Semiconductor, p. 2-4 (Apr./May 2010).

* cited by examiner

ELECTRON BEAM HEATING AND ATOMIC SURFACE RESTRUCTURING OF SAPPHIRE SURFACE

CROSS-REFERENCE TO RELATED PATENT APPLICATION(S)

This patent application claims the benefit of and priority to U.S. Provisional Patent Application No. 62/367,971, filed on Jul. 28, 2016, the contents of which is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Current thermal loading in epitaxy processes are based on electrical heating elements. These current heating methods operate by radiative or conductive heat transfer from the electrical heating elements and are not effective due to poor absorption by the optically thin and transparent sapphire substrates and due to uneven contact causing uneven heating. For example, a current rhombo-trigonal epitaxy method enables growth of a high-quality single crystalline silicon-germanium (SiGe) layer on a trigonal C-plane sapphire substrate. However, these current processes require an unusually high operational temperature to energize the cubic structure enough to be rotated and deformed into a rhombohedron anchored on a trigonal structure of sapphire.

BRIEF SUMMARY OF THE INVENTION

The systems, methods, and devices of the various embodiments may provide a mechanism to enable the growth of a rhombohedral epitaxy at a lower substrate temperature by energizing the atoms in flux, thereby reducing the substrate temperature to a moderate level. In various embodiments, sufficiently energized atoms provide the essential energy needed for the rhombohedral epitaxy process which deforms the original cubic crystalline structure approximately into a rhombohedron by physically aligning the crystal structure of both materials at a lower substrate temperature.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims Sapphire wafers are widely used as substrates on which to grow single crystal gallium nitride (GaN), SiGe, and cadmium telluride (CdTe) epitaxial layers for the fabrication various devices, such as light-emitting diodes (LEDs), power logic chips, probes, etc. Generally, the growth of high quality and single crystal epitaxy layers on sapphires requires uniform and high temperature heating to accommodate re-structuring of the sapphire surface in current systems. Such requirements of uniform heating and re-structuring of sapphire substrates present challenges for high yield and high quality production in current systems.

Figure 1:
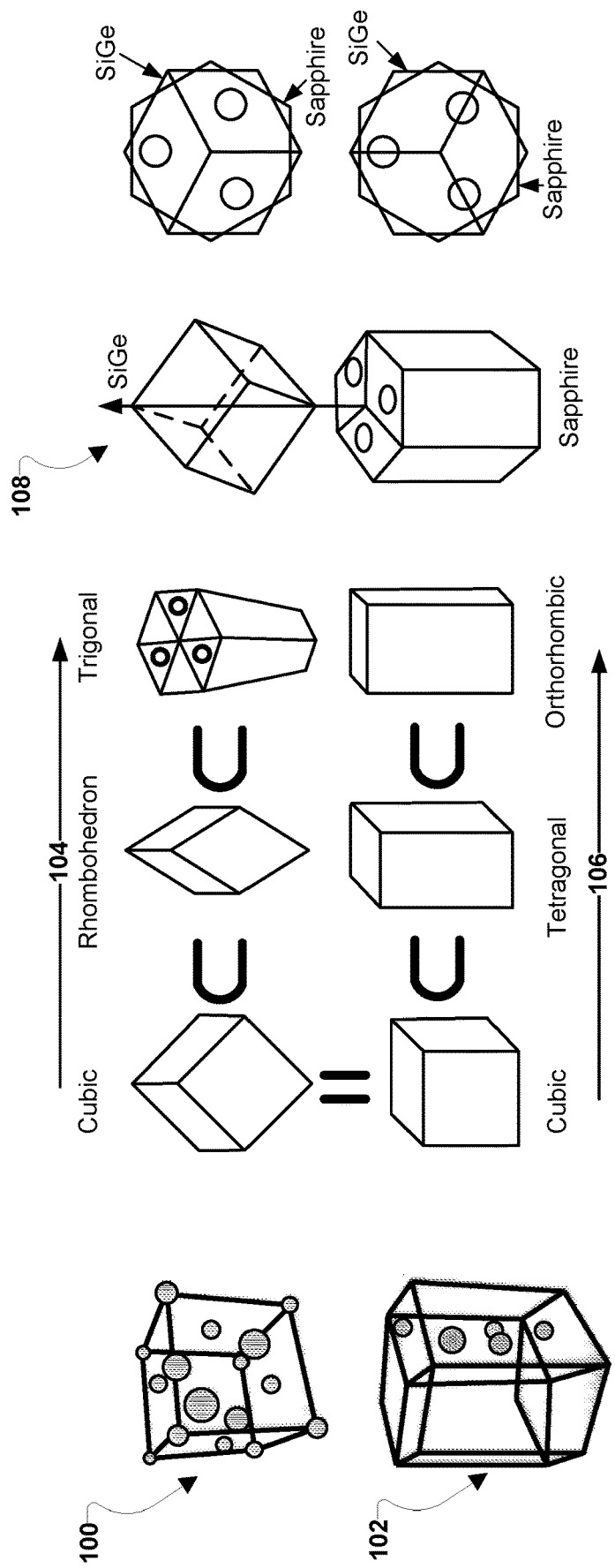
FIG. 1 illustrates the deformation process for various crystalline structures of semiconductor materials.

Epitaxial conditions for growing high quality single crystal of cubic or zinc-blende structure materials, such as SiGe and CdTe, or hexagonal structures, such GaN, on a trigonal structured sapphire, $\alpha\text{-}Al_2O_3$ (0001), substrate ensure producing high quality single crystal films, but currently require the use of extreme, impractical, and uneconomical heating systems. In current systems the sapphire substrate must undergo a long process of thermal soak at a high temperature. In order to have a lattice-matched crystalline structure of epitaxial layers of interests, the equivalence of formation energy for balancing crystal lattices must be achieved at the interface between epitaxial layer and sapphire substrate without residual or mismatch energy. Most of the energy required for pseudo-formation of equivalence is captured from the activation energy of the sapphire surface that is created during the thermal soak period in current systems. For example, FIG. 1 illustrates the deformation process for various crystalline structures of semiconductor materials. By the gained energy, the cubic 100 or zinc-blende structure 102 of crystals undergoes a re-structuring process from either a cubic structure to a tetragonal structure to an orthorhombic structure (106) or from a cubic of orientation to a rhombohedron to a trigonal 104. Therefore, the energy required for deformation of cubic into rhombohedral structure is mostly gained from the activation energy of the sapphire surface. Thermal soaking of optically thin and transparent sapphire substrates in a vacuum chamber takes a substantially long time to achieve a desirable temperature for activation of the sapphire surface since the only heat transfer mechanism in a vacuum is radiative heating in current systems. Thus, the creation of the resulting lattice-matched crystalline structure of epitaxial layers of SiGe on sapphire 108 takes a substantially long time to achieve.

To raise the temperature of optically thin and transparent sapphire to the approximately 1100° C. level for restructuring in a vacuum, the only currently available heating mechanism is radiative heat transfer to accumulate excessive heat into the sapphire to enable the sapphire to restructure itself. Current conduction heating systems are not suitable for heating to the required restructuring level unless a sapphire substrate makes complete and uniform contact with a heating element. The difference in thermal impedances through the contacts and interfaces hinders effective uniform heating in current systems. Additionally, the optically thin and transparent body of the sapphire substrate drastically reduces the absorption of thermal waves. Accordingly, current systems require a significant period of heating until the sapphire substrate reaches an equilibrium and isotropic condition with the temperature of the heater. A typical process time of SiGe epitaxial development runs at least 3 to 4 hours in current systems. In current systems, the majority of the time (e.g., over 70% of the 4 hours) is spent heating the sapphire substrate to reach at least 890° C., or above, prior to the thin-film epitaxial process. The time required to achieve equilibrium heating in current systems prevents current systems from achieving fast processing of epitaxy. The requirements for control, stabilization, and achieving an equilibrium condition of temperature with radiative heating used by current systems for any epitaxy process are unacceptable for the high yield requirement of wafer production.

The systems, methods, and devices of the various embodiments may enable the reduction of the high temperature heating requirement of sapphire substrates. Additionally, the various embodiments may enable the morphological restructuring of sapphire surfaces for hosting coating materials including cubic or zinc-blende structures that may be anchored on the sapphire surfaces while single crystal epitaxy is continuously grown thereon. The various embodiments may alleviate the burden of the thermal loading requirement within a micro structure depth of sapphire surface to be restructured. The various embodiments may alleviate the conventional thermal loading requirement by providing heating methods that are both quick and effective on an optically thin and transparent body of sapphire substrate, and at the same time that drive morphological restructuring of the sapphire surface.

The systems, methods, and devices of the various embodiments may provide a mechanism to enable the growth of a rhombohedral epitaxy, such as a high-quality single crystalline SiGe layer on a trigonal C-plane sapphire substrate, at a lower substrate temperature by energizing the atoms in flux, thereby reducing the substrate temperature to a moderate level. In various embodiments, sufficiently energized atoms provide the essential energy needed for the rhombohedral epitaxy process which deforms the original cubic crystalline structure approximately into a rhombohedron by physically aligning the crystal structure of both materials at a lower substrate temperature.

In various embodiments, a flood electron beam may be used to heat optically thin and transparent sapphire substrates. In various embodiments, the flood electron beam may be used to restructure sapphire surface morphology to be favorable for orienting and anchoring a rhombohedral form of deformed cubic in direction. The restructuring of the sapphire substrate at a high temperature may be signified by the changes in dimension and lattice constants and associated surface activation energy. The various embodiments may provide a relatively fast process for heating and restructure of surface morphology of sapphire substrates. The various embodiments may be simple, may be less complex, and may have less energy consumption than current sapphire heating processes. The various embodiments may provide effective thermal control of sapphire substrates enabling stable performances, may enable restructuring of sapphire surface morphology, and may provide for quick and high quality epitaxy processing.

In the process of wafer production, the high yield or high through-put and high quality of wafers are very important to reduce the cost and increase the value by quality enhancement. The reduction in process time enabled by the various embodiments may increase the yield and enables mass production. The various embodiments may provide an electron beam energy that will not only increase the temperature of sapphire, but also re-structure the surface morphology of sapphire with energetic (a few keV level) electrons.

Figure 2:
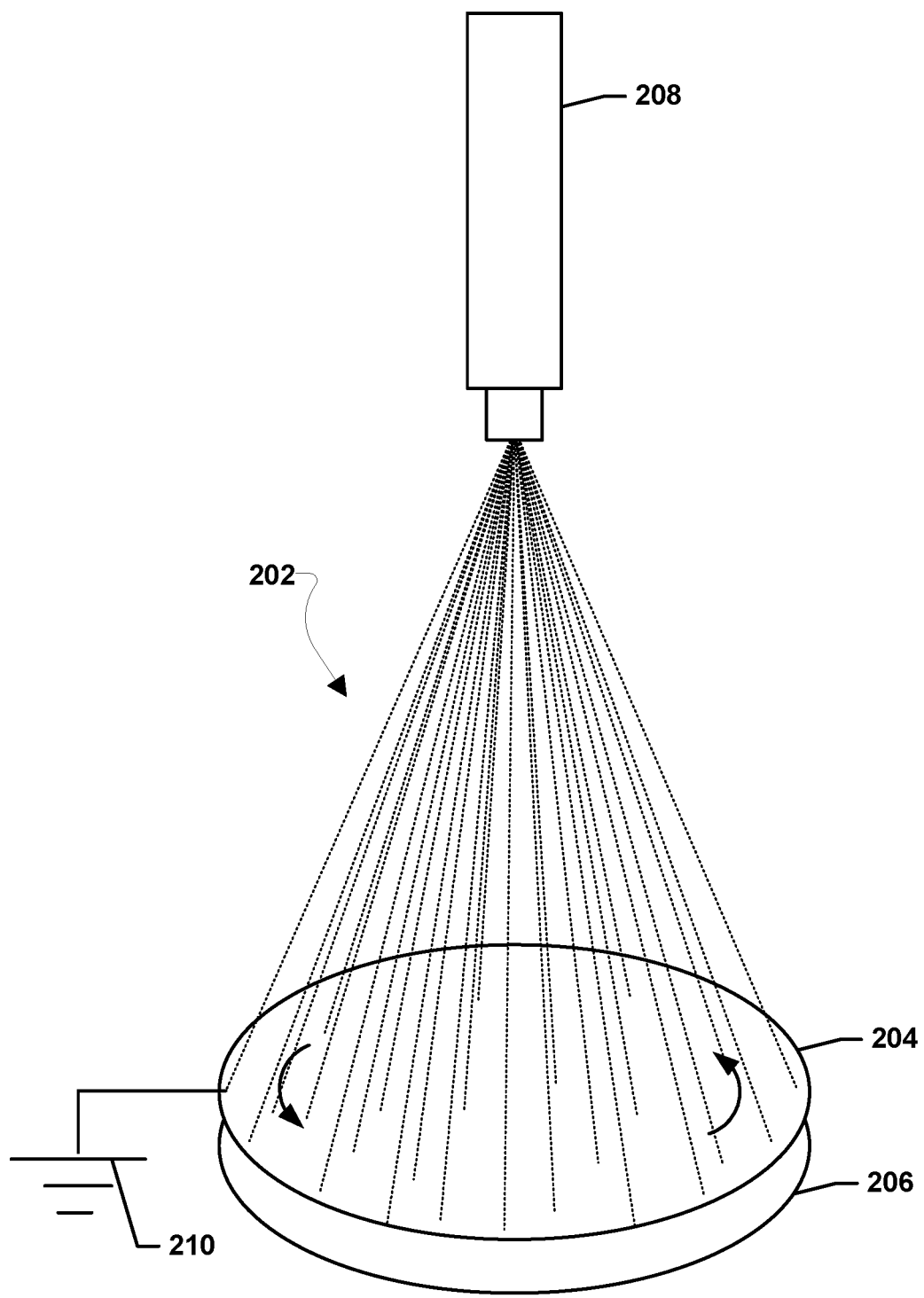
FIG. 2 shows a flood electron beam irradiating a rotating sapphire substrate while being heated to a reduced temperature according to various embodiments.

FIG. 2 shows a flood electron beam 202 from a flood electron beam gun 208 irradiating a rotating sapphire substrate 204 while being heated to a reduced temperature by a heating element 206. The flood electron beam gun 208 may be any type electron beam gun. The flood electron beam gun 208 may be selected to provide an electron beam expansion angle suitable to illuminate the whole surface area of the rotating sapphire substrate 204 based on the substrate's diameter (e.g., the profile of the flood electron beam gun 208 may be such that the expansion angle is suitable, a setting of the flood electron beam gun 208 may be set such that the expansion angle is suitable, etc.). The flood electron beam gun 208, sapphire substrate 204, and heating element 206 may be located within a growth chamber of a vacuum deposition system, and the flood electron beam 202 may be applied in a vacuum created by the vacuum deposition system. The vacuum deposition system and its various components (e.g., a sputtering gun, feed tank, etc.) are not shown in FIG. 2 for ease of illustration. The rotating sapphire substrate 204 may be connected to a ground 210. In various embodiments, the sapphire substrate 204 may be supported on a spinning platform to impart the rotation in a clockwise and/or counterclockwise direction. Various embodiment methods may utilize the flooded electron beam 202 to irradiate the surface of the sapphire substrate 204 to raise the surface temperature of the sapphire substrate 204. In various embodiments, the flood electron beam 202 may be used in conjunction with the heating element 206 to heat the surface of the sapphire substrate 204. As the electrons collide with and penetrate into the top layers of surface atoms, the sapphire substrate 204 absorbs much of the energy through thermalization losses from the electrons. Subsequently, the surface temperature rises and this modifies the atomic surface structure of the sapphire substrate 204 into a form conducive to single crystal SiGe epitaxy. For larger sizes of sapphire substrates 204, achieving uniform profile of high temperature all over the surface by a large size heating element 206 alone is quite difficult due to the significant radiative loss at an elevated temperature. However, regardless of wafer size of the sapphire substrate 204, the electron beam 202 offers instantaneous heating to a desired level of temperature of localized volume of the sapphire substrate 204 surface and at the same time the high energy carrying electrons not only thermalize evenly and uniformly, but also modify the morphology of the sapphire substrate 204 surface. The electrons accumulated on the sapphire substrate 204 after transferring their energy may be drained to ground 210 for neutralization of the sapphire substrate 204. Upon the thermalization and modification of the sapphire substrate 204 surface, an epitaxy film, such as a film of SiGe, GaN, CdTe, aluminum arsenide (AlAs)/aluminum gallium arsenide (AlGaAs), etc., may be grown on the sapphire substrate 204.

Figure 3:
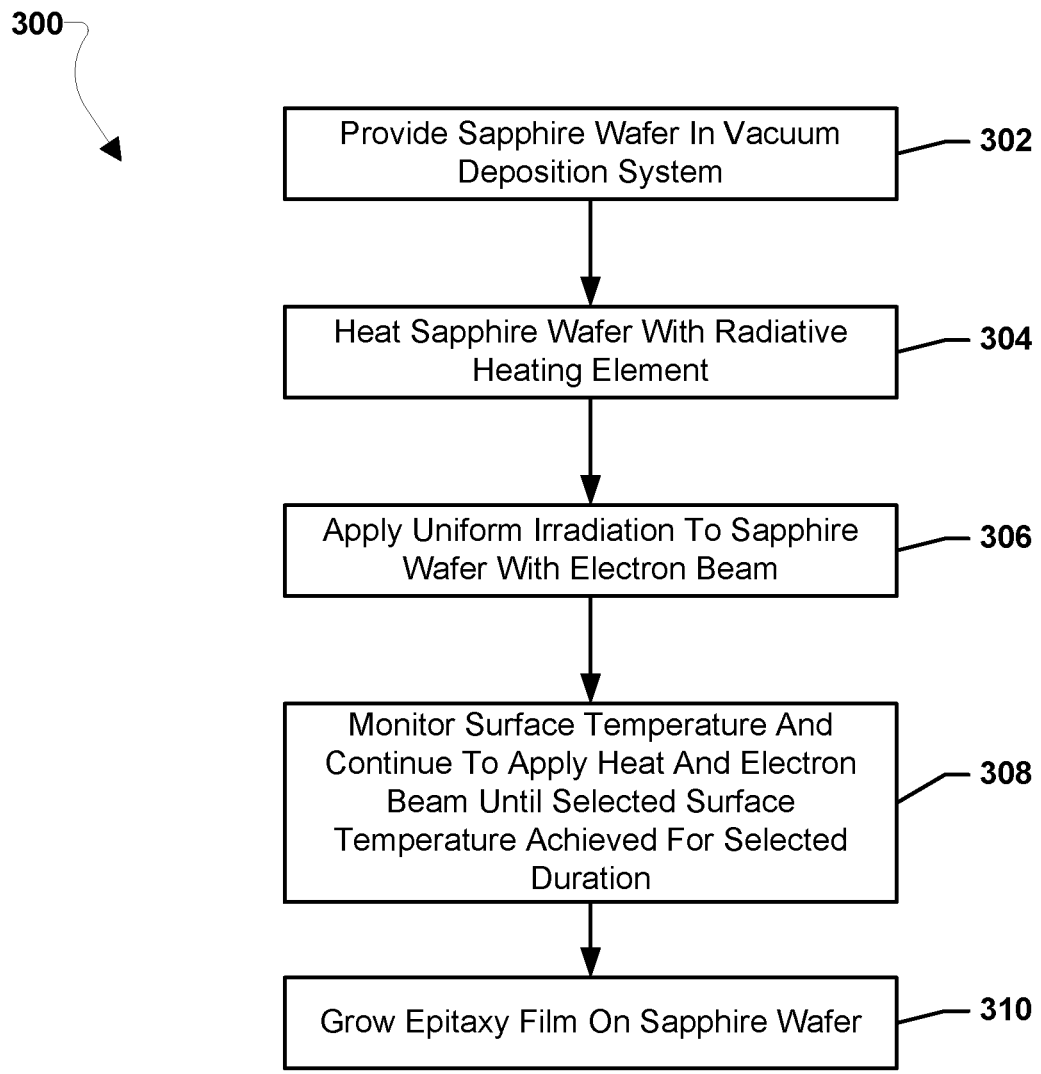
FIG. 3 is a process flow diagram illustrating an embodiment method for flood electron beam heating of a sapphire wafer.

FIG. 3 illustrates an embodiment method 300 for flood electron beam heating of a sapphire wafer. The operations of method 300 may be suitable for use with the system described above with reference to FIG. 2. In block 302 a sapphire wafer may be provided in a vacuum deposition system. For example, a sapphire wafer may be loaded into a growth chamber of a vacuum deposition system. In various embodiments, the sapphire wafer may be supported on a spinning platform and rotated during heating and irradiation operations 304-308 discussed below.

In block 304 the sapphire wafer may be heated with a radiative heating element. In a manner similar to traditional radiative heating methods, the wafer may be heated to a selected temperature, such as a temperature of 500° C., such as about 500° C., about 400° C. to about 500° C., 450° C., about 450° C., about 400° C. to about 450° C., 400° C., about 400° C., etc. In various embodiments, the radiative heating element, such as heating element 206 of FIG. 2, may be used to heat the sapphire wafer. Irradiation of the wafer with an electron beam right away before heating may risk thermal shock and breaking of the wafer, often made from brittle semiconductor or ceramic material. For example, tests of irradiation of bare sapphire wafers under a 40 keV electron beam produced an approximately 120° C. temperature increase immediately on the backside of the wafer (i.e., the wafer surface opposite the impact of the electron beam), meaning the exposed side (i.e., the wafer surface impacted by the electron beam) was much hotter. Accordingly, the substrate may be heated to typical industrial ranges, usually from about 400° C. to about 500° C., before applying electron beam irradiation. This pre-heating may lessen the effects of the thermal gradient between the surface and the substrate backside, lowering the stresses and the likelihood of fracture.

In block 306 uniform electron beam irradiation may be applied to the sapphire wafer with the electron beam, such as electron beam 202. Effective heating of the wafer surface may require high energy (~40-50 keV) and high current (~1 mA) settings on the electron beam power supply. Moreover, the irradiation may be uniform over the wafer area, usually accomplished via an electron flood type gun. If the beam is too focused, a thermal gradient may develop within the wafer plane, leading to a thermal stress-induced fracture of the wafer. Fortunately, electron irradiation of sapphire produces blue and purple light, allowing the beam spot size to be visualized. This may be useful in calibrating and tuning the electron beam parameters to achieve uniform irradiation.

Figure 4:
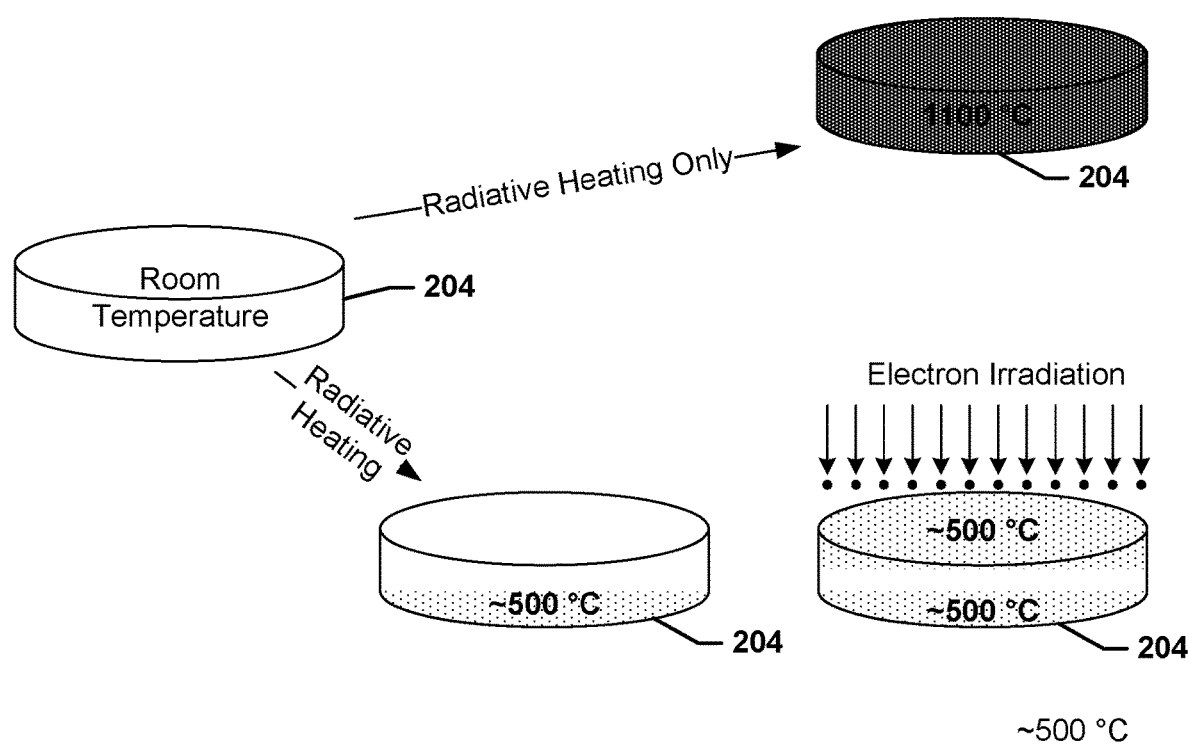
FIG. 4 is a comparison of surface modification techniques between radiative heating only techniques and embodiment methods for electron irradiation.

In block 308 the surface temperature may be monitored and the radiative heating and electron beam uniform irradiation may continue to be applied until a selected surface temperature is achieved for a selected duration. In this manner, the temperature of the substrate may be allowed to rise and the surface may be allowed to restructure. Atomic surface structure may be key to obtaining a desirable interface between SiGe and sapphire, resulting in a high quality film. The temperature may be allowed to stabilize and the surface reconstruction given time to rearrange. However, electron beam heating is rather fast, and may not require more than 1-2 minutes for the wafer surface to be ready. For example, the selected surface temperature may be 500° C., such as about 500° C., about 400° C. to about 500° C., 450° C., about 450° C., about 400° C. to about 450° C., 400° C., about 400° C., etc., and the selected duration may be about 2 minutes, such as 2 minutes, about 1 minute to about 2 minutes, about 1.5 minutes, about 1 to about 1.5 minutes, about 1 minute, 1 minute, etc. Additionally, for the fast restructure of the sapphire surface, a small amount of hydrogen mixed with majority argon may fill the vacuum chamber to allow the hydrogen atom to capture an oxygen atom away from the sapphire surface, eventually leaving a strongly aluminum-terminated surface if it energizes and modifies a cubic or zinc-blende structure of epitaxy into rhombohedral structure for better anchoring with at least pseudo-equilibrium of interfacial formation. For example, FIG. 4 shows how the surface restructure can be achieved without extreme heating. The electron beam irradiation may allow surface restructuring almost instantaneously without heating extremely for so long as required by current systems.

In block 310 the method 300 may end and an epitaxy film, such as a SiGe film, may be grown on the sapphire wafer. In various embodiments, the heating by the radiative heating element and/or uniform irradiation by the electron beam may be ceased during film growth.

FIG. 4 is a comparison of surface modification techniques between radiative heating only techniques and embodiment methods for electron irradiation, such as method 300 described above. In both techniques the sapphire wafer 204 may start at room temperature. In the techniques utilized in current systems, the wafer 204 may be heated, by radiative heating only, to about 1100° C. Thus, achieving the desired surface structure is accomplished through extreme heating which is effective, but impractical. In the embodiment methods, from room temperature, radiative heating is applied to a back surface of the wafer 204 to heat it to much more reasonable temperatures, such as about 500° C. Then following with a uniform irradiation of high energy (e.g., ~50 keV and ~1 mA current) electrons to heat only the surface to the selected temperature (e.g., 500° C.) and achieve the desired surface structure.

Three major gains may be achieved with the various embodiment methods. First, the embodiment methods may be much faster at heating than a traditional substrate heater. Sapphire is optically thin and transparent, making it difficult to heat with traditional radiative heating to the required temperature for SiGe growth as most photons carrying the energy pass through the wafer. An electron beam does not suffer from this drawback as all electrons are absorbed onto the sapphire surface, and will heat sapphire or any transparent substrate quickly and effectively. Second, the embodiment methods may provide another independent mechanism for modifying surface structure as using an electron beam may only affect the top surface, rather than heating the entire wafer. For doped semiconductor devices, this may help prevent un-desired diffusion of the dopant atoms. This may also enable surface charging and localized heating, which may prove useful in other epitaxial growth techniques. For instance, the atomic structure may rearrange when negatively charged, which in turn may produce sharper interfaces and higher quality epitaxial layers. Third, the embodiment methods may aid in economical production of epitaxial layers requiring high surface temperature. Eliminating the need for 1100° C. substrate heater temperatures is paramount for making SiGe/sapphire industrially feasible. Most industrial manufacturing processes generally run around 400-500° C., and manufacturers cannot afford the equipment wear and downtime arising from substrate heater requirements at 1100° C. Electron beam heating allows higher wafer throughput and device yield, while easily adapting into current manufacturing techniques. Moreover, other technology may benefit from the embodiment methods, such as GaN on sapphire (which currently requires ~890° C.) or AlAs/AlGaAs on gallium arsenide (GaAs) (which currently requires ~1000° C.). The various embodiments may also be used in desorption of surface oxide prior to growth, which traditionally has required holding at higher-than-growth temperatures to remove.

While discussed above in relation to sapphire substrates (e.g., sapphire wafers, etc.), the various embodiments may be applied to any other substrate or wafer material, and any other substrate or wafer material may be substituted in the various embodiments for the sapphire wafers. For example, a GaAs wafer or substrate may be used in the various embodiments. Thus, sapphire substrates and wafers are used merely as an example to better illustrate aspects of the various embodiments. As such, the various embodiments may provide methods for changing surface temperature and atomic structure of any type substrate, sapphire, GaAs, or any other type.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A method for heating a wafer to support epitaxy film growth on the wafer, comprising:
   providing the wafer, wherein the wafer is a sapphire wafer;
   heating the wafer with a radiative heating element;
   locally restructuring a crystalline structure of a surface of the wafer by applying irradiation to locally heat the surface of the wafer with an electron beam until the surface of the wafer reaches a selected surface temperature for a selected duration, wherein applying the irradiation includes modifying the atomic crystalline structure of the surface of the wafer by colliding electrons of the electron beam with surface atoms in a top layer of the wafer and therein heating the surface atoms to a temperature that is higher than the temperature of the rest of the wafer and sufficient to provide energy needed for deforming an original cubic crystalline structure of a growing epitaxy film into a rhombohedron; and
   growing the epitaxy film on the wafer during or after applying the irradiation, wherein growing the epitaxy film includes using the modified atomic surface crystalline structure to facilitate single-crystal epitaxial layer growth.

2. The method of claim 1, wherein
   applying the irradiation comprises uniformly applying the irradiation to heat a thin region of the surface of the wafer to a higher temperature, relative to a temperature of the rest of the wafer, wherein the thin region is a top layer of surface atoms, and
   growing the epitaxy film includes using the restructured crystalline structure to orient and anchor the epitaxial film to the wafer as the epitaxial film is grown.

3. The method of claim 2, wherein heating the wafer with the radiative heating element includes heating the entire wafer to a first temperature from about 400° C. to about 500° C.

4. The method of claim 3, wherein the selected duration is from about 1 minute to about 2 minutes.

5. The method of claim 4, wherein the selected surface temperature is about 500° C. and the selected duration is about 2 minutes.

6. The method of claim 3, wherein the epitaxy film comprises SiGe, CdTe, or GaN.

7. The method of claim 2, further comprising rotating the wafer while applying the irradiation.

8. A vacuum deposition system, comprising:
a growth chamber configured to support a sapphire wafer therein, the sapphire wafer having a diameter;
a radiative heating element configured to heat a back surface of the sapphire wafer;
a flood electron beam gun rated for providing 40 keV to 50 keV electron beam energy, wherein the flood electron beam gun is configured in the growth chamber to make an expansion angle of an electron beam of the flood electron beam gun illuminate a whole surface area of a front surface of the sapphire wafer opposite the back surface based on the sapphire wafer's diameter and wherein the flood electron beam gun has been configured in the growth chamber such that the electron beam uniformly irradiates and evenly heats the front surface of the sapphire wafer via thermalization losses from colliding electrons of the electron beam with the front surface of the sapphire wafer to modify the crystalline structure of the surface by the collision of the colliding electrons of the electron beam with surface atoms in a top layer of the sapphire wafer and therein heating the surface atoms to a temperature that is sufficient to provide energy needed for deforming an original cubic crystalline structure of a growing epitaxy film into a rhombohedron to facilitate single-crystal epitaxial layer growth.

9. The system of claim 8, wherein the flood electron beam gun is configured and arranged to irradiate the substrate surface to heat a thin region of the top substrate surface of the sapphire wafer to a higher temperature sufficient to cause restructuring of the crystalline structure of the thin region of the surface of the sapphire wafer, such that the epitaxy film is oriented and anchored by the restructured crystalline structure.

10. The system of claim 9, wherein the radiative heating element is configured and arranged to heat the sapphire wafer to a temperature from about 400° C. to about 500° C.

11. The system of claim 10, wherein the selected duration is from about 1 minute to about 2 minutes.

12. The system of claim 11, wherein the selected surface temperature is about 500° C. and the selected duration is about 2 minutes.

13. The system of claim 12, wherein the epitaxy film comprises SiGe, CdTe, or GaN.

14. The system of claim 9, further comprising a spinning platform configured to support and impart a rotation to the sapphire wafer while the electron beam irradiates the top surface and while the radiative heating element heats the back surface.

15. The method of claim 1, wherein growing the epitaxy film includes using the modified atomic surface structure to promote growth of a rhombohedral crystalline film by physically aligning the crystalline structure of the modified atomic surface structure with the crystalline structure of the epitaxy film as it is grown.

16. The system of claim 8, further including a sputtering gun configured and arranged with the flood electron beam gun to grow the epitaxy film on the sapphire wafer by sputtering particles and using the modified atomic crystalline structure to control crystallization formation of the particles and a resulting orientation thereof upon the surface.

17. The system of claim 8, wherein the flood electron beam gun and the radiative heating element are positioned oppositely from each other with the sapphire wafer between them and with the flood electron beam gun oriented perpendicularly to the sapphire wafer.

* * * * *